(12) United States Patent
Jung et al.

(10) Patent No.: US 11,183,651 B2
(45) Date of Patent: Nov. 23, 2021

(54) ELECTRONIC APPARATUS

(71) Applicant: Samsung Display Co., Ltd., Yongin-si (KR)

(72) Inventors: Taehyeog Jung, Hwaseong-si (KR); Yong-kwan Kim, Yongin-si (KR); Mansik Myeong, Seoul (KR); Sungchul Choi, Hwaseong-si (KR); Dongwoo Seo, Suwon-si (KR); Jangdoo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 432 days.

(21) Appl. No.: 15/917,462

(22) Filed: Mar. 9, 2018

(65) Prior Publication Data
US 2018/0375043 A1 Dec. 27, 2018

(30) Foreign Application Priority Data

Jun. 23, 2017 (KR) .................. 10-2017-0079933

(51) Int. Cl.
*H01L 51/00* (2006.01)
*H01L 27/32* (2006.01)
(Continued)

(52) U.S. Cl.
CPC ............ *H01L 51/0097* (2013.01); *B32B 7/12* (2013.01); *B32B 15/08* (2013.01); *B32B 27/08* (2013.01);
(Continued)

(58) Field of Classification Search
CPC ......... B32B 7/12; B32B 15/08; B32B 17/064; B32B 27/08; B32B 27/325; B32B 2307/412; B32B 2307/42; B32B 2307/546; B32B 2457/202; B32B 2457/206; B32B 2457/208; H01L 51/0097; H01L 27/3232; H01L 27/3262; H01L 51/5004; H01L 51/5246; H01L 27/323; H01L 27/3241;
(Continued)

(56) References Cited

U.S. PATENT DOCUMENTS 9,461,269 B2 10/2016 Lee et al.
10,033,015 B1 * 7/2018 Brotzman ............. B32B 27/308
(Continued)

FOREIGN PATENT DOCUMENTS

CN 102076803 A 5/2011
CN 104576684 A 4/2015
(Continued)

OTHER PUBLICATIONS

First Office action issued in corresponding Chinese Application No. 201810653104.0, dated Jun. 10, 2021, 8 pages.

*Primary Examiner* — Catherine A. Simone
(74) *Attorney, Agent, or Firm* — Lewis Roca Rothgerber Christie LLP

(57) ABSTRACT

An electronic apparatus includes a first adhesive member having a first modulus, a second adhesive member having a second modulus, and a flexible member between, and contacting, the first adhesive member and the second adhesive member, wherein a stress relaxation of the first adhesive member is about 70% or less, and wherein an absolute value of a difference between the first modulus and the second modulus is about 0.01 MPa or less.

19 Claims, 12 Drawing Sheets

(51) Int. Cl.
  *B32B 7/12* (2006.01)
  *B32B 15/08* (2006.01)
  *B32B 27/08* (2006.01)
  *B32B 27/32* (2006.01)
  *H01L 51/50* (2006.01)
  *H01L 51/52* (2006.01)

(52) U.S. Cl.
  CPC ........ *B32B 27/325* (2013.01); *H01L 27/3232* (2013.01); *H01L 27/3262* (2013.01); *H01L 51/5004* (2013.01); *H01L 51/5246* (2013.01); *B32B 2307/412* (2013.01); *B32B 2307/42* (2013.01); *B32B 2307/546* (2013.01); *B32B 2457/202* (2013.01); *B32B 2457/206* (2013.01); *B32B 2457/208* (2013.01); *H01L 27/323* (2013.01); *H01L 27/3241* (2013.01); *H01L 51/524* (2013.01); *H01L 2251/5338* (2013.01); *H01L 2251/55* (2013.01)

(58) Field of Classification Search
  CPC ........... H01L 51/524; H01L 2251/5338; H01L 2251/55; G06F 1/1652; G06F 2203/04102; G09F 9/301; G02F 1/133305
  USPC ....................................... 428/40.1, 343, 354
  See application file for complete search history.

(56) References Cited

U.S. PATENT DOCUMENTS

| | | | |
|---|---|---|---|
| 10,622,581 B2 * | 4/2020 | Hu | ........................ B32B 17/00 |
| 2011/0073901 A1 | 3/2011 | Fujita et al. | |
| 2014/0293420 A1 * | 10/2014 | Ko | ...................... H01L 51/5281 |
| | | | 359/489.07 |
| 2015/0185782 A1 | 7/2015 | Kim et al. | |
| 2015/0200375 A1 | 7/2015 | Kim et al. | |
| 2015/0201487 A1 * | 7/2015 | Kee | ..................... G02F 1/13338 |
| | | | 361/749 |
| 2017/0080680 A1 | 3/2017 | Lee et al. | |
| 2017/0200915 A1 * | 7/2017 | Lee | ...................... G02B 5/3033 |

FOREIGN PATENT DOCUMENTS

| | | | |
|---|---|---|---|
| CN | 106548712 A | 3/2017 | |
| KR | 10-2015-0078001 | 7/2015 | |
| KR | 10-2015-0084257 | 7/2015 | |
| KR | 10-2015-0084260 | 7/2015 | |
| KR | 10-1659239 | 9/2016 | |
| WO | 2016068661 A2 | 5/2016 | |
| WO | WO-2017066364 A1 * | 4/2017 | ............. B32B 17/06 |

* cited by examiner

ELECTRONIC APPARATUS

CROSS-REFERENCE TO RELATED APPLICATION

This application claims priority to, and the benefit of, Korean Patent Application No. 10-2017-0079933, filed on Jun. 23, 2017, the content of which in its entirety is herein incorporated by reference.

BACKGROUND

1. Field

Embodiments of the invention relate to a flexible electronic apparatus with improved reliability.

2. Description of the Related Art

Bendable or foldable electronic apparatuses have been actively developed. These flexible electronic apparatuses include flexible display panels (or flexible touch panels) and various outer members. The outer members have different functions from each other. The outer members are located on at least one surface of the electronic apparatus. The outer members are bent or folded together with the electronic apparatus.

SUMMARY

Embodiments of the invention may provide an electronic apparatus capable of improving reliability with respect to stress caused by bending or folding.

In one embodiment, an electronic apparatus includes a first adhesive member having a first modulus, a second adhesive member having a second modulus, and a flexible member between, and contacting, the first adhesive member and the second adhesive member, wherein a stress relaxation of the first adhesive member is about 70% or less, and wherein an absolute value of a difference between the first modulus and the second modulus is about 0.01 MPa or less.

A radius of curvature of the first adhesive member may be smaller than a radius of curvature of the second adhesive member with respect to a common curvature center, and the first modulus may be greater than the second modulus.

A radius of curvature of the flexible member may be about 10 mm or less.

Each of the first modulus and the second modulus may be about 0.06 MPa or less at about 60° C.

Each of the first and second adhesive members may include one or more of a silicon-based polymer, a urethane-based polymer and an acrylic-based polymer, a crosslinking agent, and a resin.

The flexible member may include at least one of a polarizing film, a display panel, or a touch panel.

The flexible member may include a plurality of films.

The electronic apparatus may further include a window member on and contacting the first adhesive member, and a cover member under and contacting the second adhesive member.

The window member may include a polymer film, a plastic substrate, or a thin glass film.

The cover member may include a metal.

In another embodiment, an electronic apparatus includes a display panel, a polarizing film on the display panel, a window member on the polarizing film, a first adhesive member between and contacting the window member and the polarizing film, and having a first modulus, and a second adhesive member between and contacting the polarizing film and the display panel, and having a second modulus, wherein a stress relaxation of the first adhesive member is about 70% or less, and wherein an absolute value of a difference between the first modulus and the second modulus is about 0.01 MPa or less.

The polarizing film may include a plurality of layers.

The plurality of layers may include a phase retardation film and a cyclo-olefin polymer (COP) film.

Each of the first modulus and the second modulus may be about 0.06 MPa or less at about 60° C.

Each of the first and second adhesive members may include one or more of a silicon-based polymer, a urethane-based polymer and an acrylic-based polymer, a crosslinking agent, and a resin.

The window member may include a thin glass film.

A radius of curvature of the first adhesive member may be smaller than a radius of curvature of the second adhesive member with respect to a common curvature center, and the first modulus may be greater than the second modulus.

A radius of curvature of the first adhesive member may be about 10 mm or less.

The second modulus may be greater than the first modulus, and the absolute value of the difference between the first modulus and the second modulus may be about 0.005 MPa or less.

In still another embodiment, an electronic apparatus includes a display panel, a polarizing film on the display panel, a window member on the polarizing film, a sensing member between the polarizing film and the window member to sense an external touch provided to the window member, a first adhesive member between and contacting the window member and the sensing member, and having a first modulus, and a second adhesive member between and contacting the sensing member and the polarizing film, and having a second modulus, wherein a stress relaxation of the first adhesive member is about 70% or less, and wherein an absolute value of a difference between the first modulus and the second modulus is about 0.01 MPa or less.

BRIEF DESCRIPTION OF THE DRAWINGS

The above and other aspects of embodiments of the invention will become more apparent by describing in further detail different embodiments thereof with reference to the accompanying drawings, in which.

DETAILED DESCRIPTION

Figure 1:
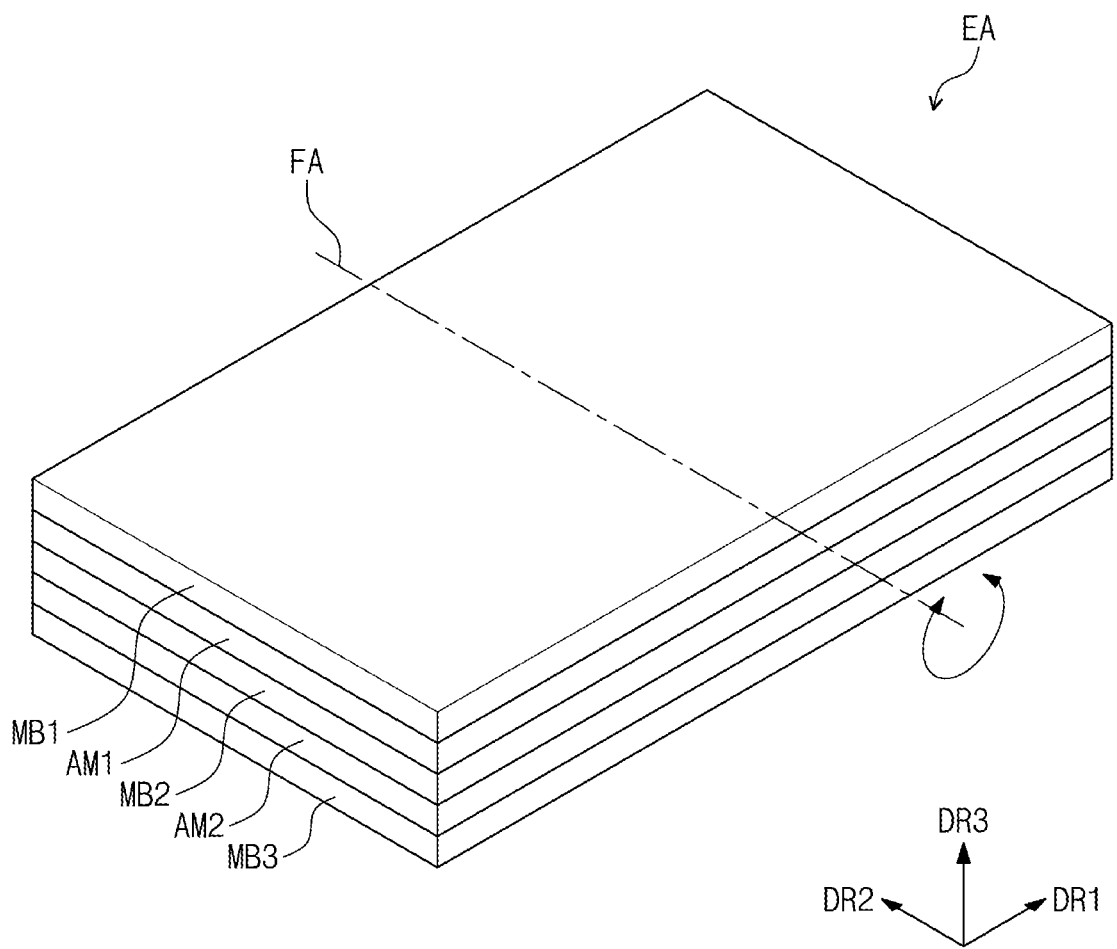
FIG. 1 is a perspective view illustrating an unfolded state of an electronic apparatus according to an embodiment of the invention.

Features of the inventive concept and methods of accomplishing the same may be understood more readily by reference to the following detailed description of embodiments and the accompanying drawings. Hereinafter, embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. Further, parts not related to the description of the embodiments might not be shown to make the description clear. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
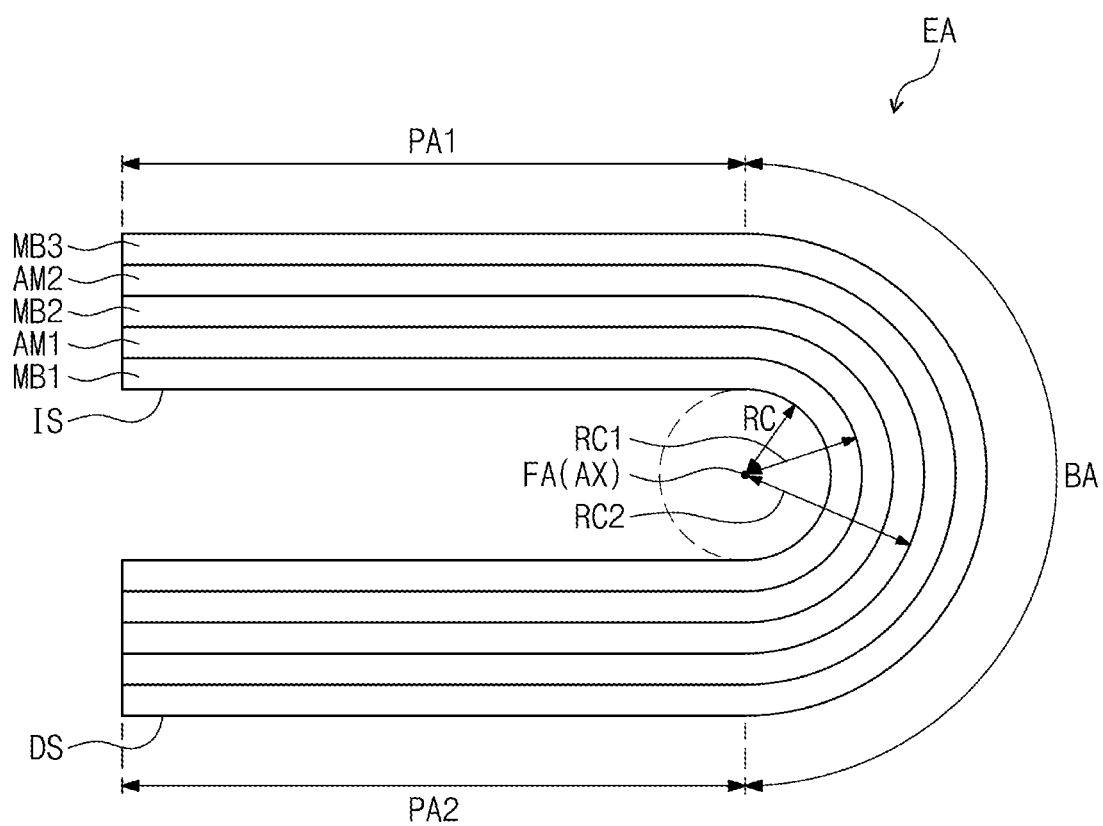
FIG. 2 is a cross-sectional view illustrating a folded state of the electronic apparatus of FIG. 1.

FIG. 1 is a perspective view illustrating an unfolded state of an electronic apparatus according to an embodiment of the invention. FIG. 2 is a cross-sectional view illustrating a folded state of the electronic apparatus of FIG. 1. Hereinafter, the electronic apparatus EA according to an embodiment of the invention will be described with reference to FIGS. 1 and 2.

An electronic apparatus EA is driven by an electrical signal applied thereto. The electronic apparatus EA may be, but is not limited to, a touch sensing apparatus, a display apparatus, or a touch screen apparatus. In the present embodiment, the electronic apparatus EA corresponding to the display apparatus will be described as an example for the purpose of ease and convenience in description.

The electronic apparatus EA may be variously deformed by external force. The electronic apparatus EA may be unfolded, rolled to have a curved surface (e.g., a predetermined curved surface), or partially folded by the external force.

For example, as illustrated in FIG. 1, the electronic apparatus EA may have an unfolded shape in a first mode. The first mode may operate for a specific time or purpose, and may be an unfolded state of the electronic apparatus EA.

In the first mode, the electronic apparatus EA may have a rectangular plate shape that has a hexahedral structure defined by planes that are substantially parallel to a plane defined by first and second directions DR1 and DR2, and that has a thickness defined in a third direction DR3. However, this shape is described only as an example. In other embodiments, in the first mode, the electronic apparatus EA may have one of various shapes, such as a circular plate shape and a triangular plate shape. However, the shape of the electronic apparatus EA in the first mode is not limited to any particular one of these embodiments.

The electronic apparatus EA includes a first member MB1, a second member MB2, a third member MB3, a first adhesive member AM1, and a second adhesive member AM2.

The first adhesive member AM1 is located between the first member MB1 and the second member MB2. Thus, the first member MB1 and the second member MB2 are spaced apart from each other in a thickness direction (e.g., the third direction DR3) with the first adhesive member AM1 interposed therebetween.

The first adhesive member AM1 physically couples the first member MB1 and the second member MB2 to each other. The first adhesive member AM1 may be an adhesive layer formed by applying and hardening a liquid adhesive material, or may be a separately formed adhesive sheet. For example, the first adhesive member AM1 may be formed of an adhesive material. For example, the adhesive material may comprise a pressure sensitive adhesive (PSA), an optical clear adhesive (OCA), or an optical clear resin (OCR). The adhesive material may include one or more selected from a group including a silicon-based polymer, a urethane-based polymer, an acrylic-based polymer, a crosslinking agent, and a resin.

The second adhesive member AM2 is located between the second member MB2 and the third member MB3. Thus, the second member MB2 and the third member MB3 are spaced apart from each other in the third direction DR3 with the second adhesive member AM2 interposed therebetween.

The second adhesive member AM2 physically couples the second member MB2 and the third member MB3 to each other. The second adhesive member AM2 may be an adhesive layer formed by applying and hardening a liquid adhesive material, or may be a separately formed adhesive sheet. For example, the second adhesive member AM2 may be formed of a pressure sensitive adhesive (PSA), an optical clear adhesive (OCA), or an optical clear resin (OCR).

The first member MB1, the second member MB2 and the third member MB3 may be respectively coupled to each other by the first adhesive member AM1 and the second adhesive member AM2. Each of the first, second and third members MB1, MB2, and MB3 may be a window member, a touch member, a display member, a touch screen member, an optical member, a protective member, or any combination thereof.

For example, the first member MB1 may be a window member in the present embodiment. The first member/window member MB1 may be optically transparent. The window member MB1 protects the electronic apparatus EA from an external impact or from an external environment.

The window member MB1 may include a flexible material. For example, the window member MB1 may be a polymer film or a plastic substrate.

Alternatively, the window member MB1 may be a thin glass substrate. For example, the window member MB1 may be a glass substrate having a thickness of about 100 μm or less. In this case, the window member MB1 may have flexibility even though it includes glass that normally corresponds to a rigid material.

For example, the second member MB2 may be an optical member. The second member/optical member MB2 may include a plurality of polymer films. For example, the optical member MB2 may include at least one of a polarizing film, an anti-reflection film, a phase difference film/phase retardation film, a cyclo-olefin polymer film, a compensation film, or an anti-scattering film. The optical member MB2 is located between the first and second adhesive members AM1 and AM2 and is in contact with the first and second adhesive members AM1 and AM2.

For example, the third member MB3 may be the display member. The third member/display member MB3 may generate and display an image in response to electrical signals. The image displayed by the third member MB3 may be visible on the outside of the device through the first member MB1.

The display member MB3 includes a display surface that is defined by the first direction DR1, and by the second direction DR2, that intersects the first direction DR1. The display member MB3 displays an image to the outside through the display surface. FIG. 1 illustrates an embodiment in which the display surface is provided toward the third direction DR3, or in an upward direction. However, embodiments of the invention are not limited thereto. In other embodiments, the display surface may be provided toward a direction that is opposite to the third direction DR3, or the display member MB3 may display images through both surfaces (e.g., both top and bottom surfaces).

The display member MB3 may be a liquid crystal display panel, an organic light-emitting display panel, an electrophoretic display panel, or an electrowetting display panel. In the present embodiment, the organic light-emitting display panel is used as the display member MB3. This will be described later in more detail.

As illustrated in FIG. 2, the electronic apparatus EA may have a folded shape in a second mode. The second mode may operate for a time period, or for a purpose, that is different from that of the first mode, and may be a folded state of the electronic apparatus EA.

The electronic apparatus EA may be bent or folded on, along, or with respect to a folding axis FA in the second mode. The folding axis FA may be an imaginary line, and the electronic apparatus EA may be bent such that it surrounds the folding axis FA.

The electronic apparatus EA may be bent at a radius RC of curvature (e.g., a predetermined radius of curvature). The radius RC of curvature may be defined as the shortest distance between a curvature center AX and the electronic apparatus EA. The curvature center AX may be a point through which the folding axis FA passes. For example, the radius RC of curvature may be the shortest distance from the folding axis FA to an inner surface IS of the electronic apparatus EA.

In the present embodiment, the radius RC of curvature may be about 10 mm or less. The electronic apparatus EA according to an embodiment of the invention may have improved bending characteristics at a relatively fine, tight, or small curvature. This will be described later in more detail.

At this time, the window member MB1, the optical member MB2, the display member MB3, the first adhesive member AM1 and the second adhesive member AM2 of the electronic apparatus EA are bent along the folding axis FA. In this case, because the first and second adhesive members AM1 and AM2 are located at different distances from the curvature center AX, the first and second adhesive members AM1 and AM2 may have different radii of curvature.

In other words, the radius RC1 of curvature of the first adhesive member AM1 may be different from the radius RC2 of curvature of the second adhesive member AM2. In the present embodiment, because a distance between the first adhesive member AM1 and the curvature center AX is smaller than a distance between the second adhesive member AM2 and the curvature center AX, the radius RC1 of curvature of the first adhesive member AM1 may be smaller than the radius RC2 of curvature of the second adhesive member AM2.

However, embodiments of the invention are not limited thereto. In other embodiments, the electronic apparatus EA may be bent in such a way that the radius RC1 of curvature of the first adhesive member AM1 is greater than the radius RC2 of curvature of the second adhesive member AM2.

As illustrated in FIG. 2, when in the second mode, the electronic apparatus EA may include a bending area BA, a first planar area PA1, and a second planar area PA2. The bending area BA, the first planar area PA1, and the second planar area PA2 may be defined depending on a bent state of the electronic apparatus EA.

The bending area BA may be relatively greatly deformed as compared to the first planar area PA1 and the second planar area PA2. Because the electronic apparatus EA is bent on the folding axis FA, the shape of the bending area BA may be deformed. Thus, the bending area BA may have a curved surface.

The first planar area PA1 and the second planar area PA2 may be relatively less deformed as compared to the bending area BA. In the present embodiment, each of the first and second planar areas PA1 and PA2 has a substantially flat shape similarly to that of the electronic apparatus EA in the first mode.

However, embodiments of the invention are not limited thereto. In another embodiment, the first planar area PA1 and the second planar area PA2 may be omitted in the electronic apparatus. For example, the electronic apparatus EA may be bent or rolled in such a way that it has a surface that is entirely curved. In this case, an entirety of the electronic apparatus may correspond to the bending area BA. The electronic apparatus EA according to an embodiment of the invention may have at least one of various shapes in the second mode, and the invention is not limited to a specific embodiment.

Figure 3:
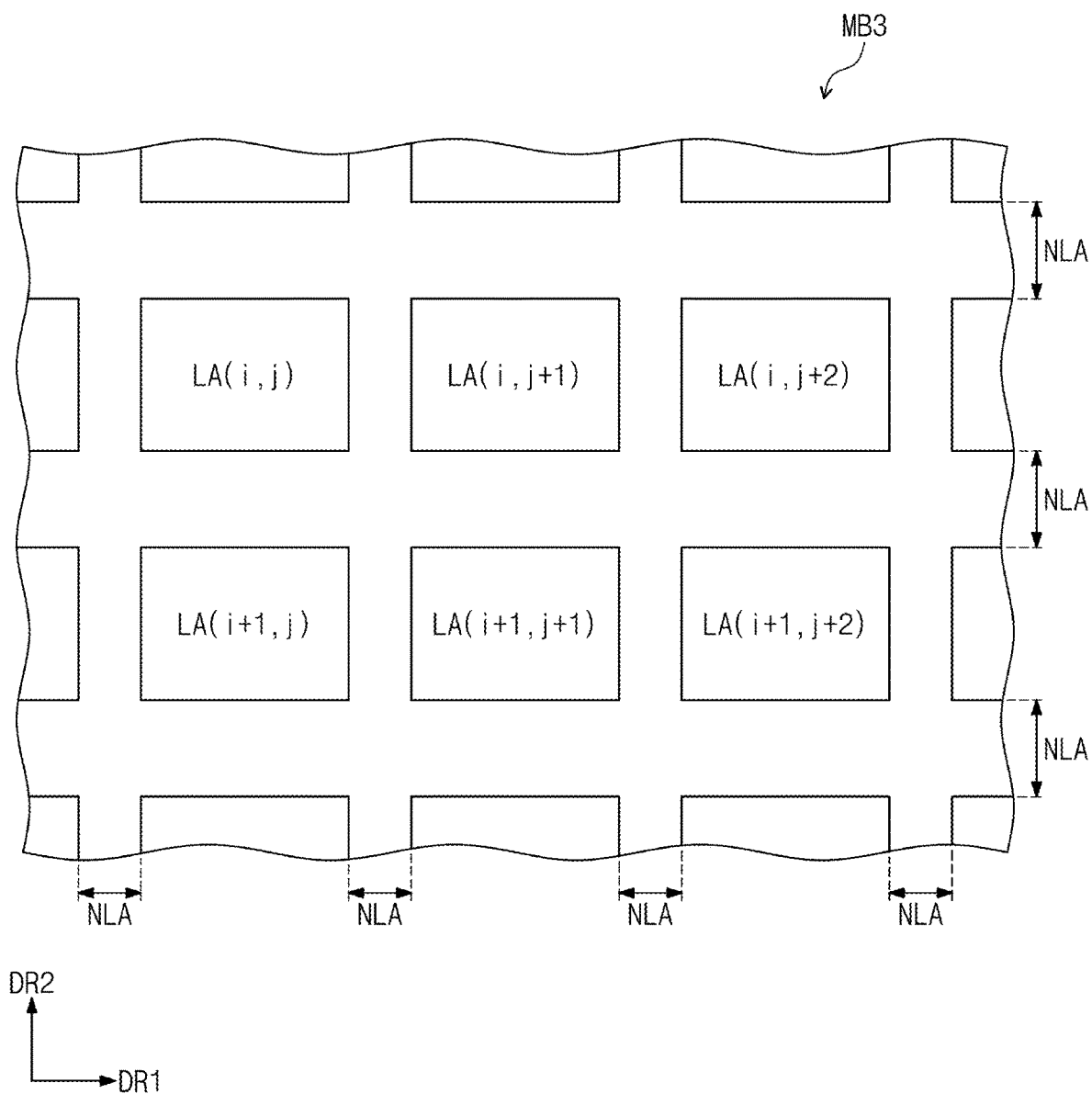
FIG. 3 is a partial plan view illustrating a portion of the electronic apparatus of FIG. 1.
Figure 4:
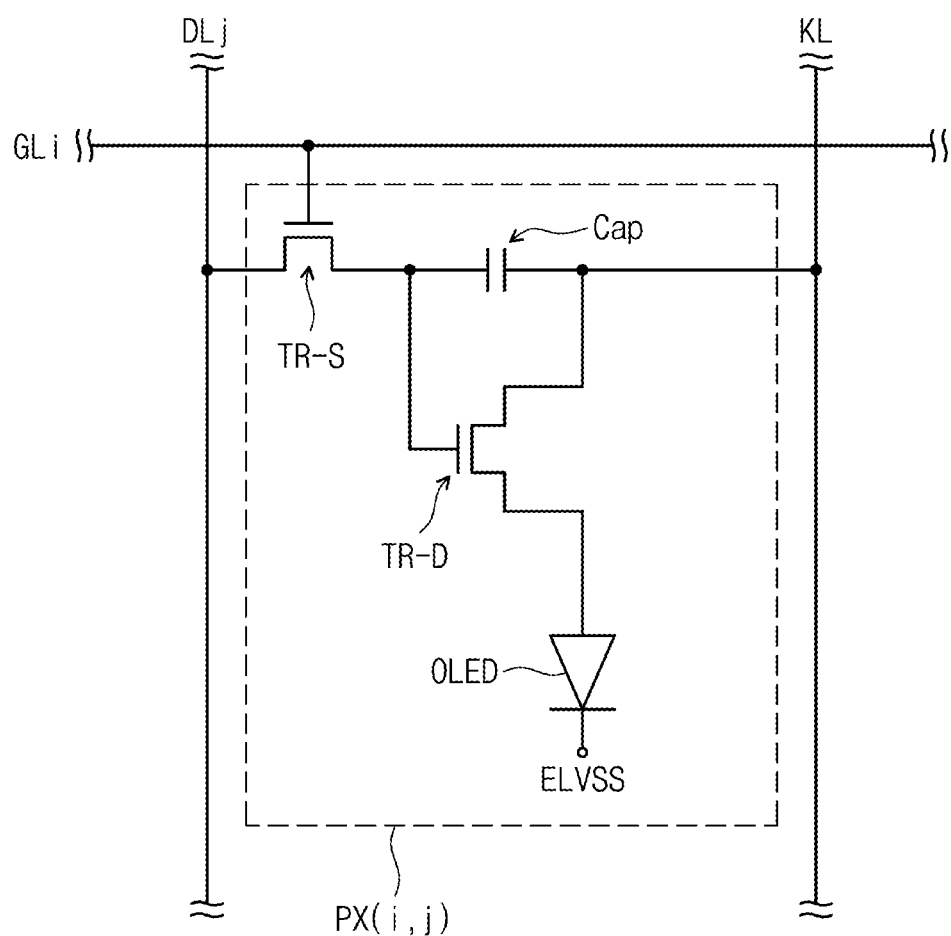
FIG. 4 is an equivalent circuit diagram of a pixel according to an embodiment of the invention.
Figure 5:
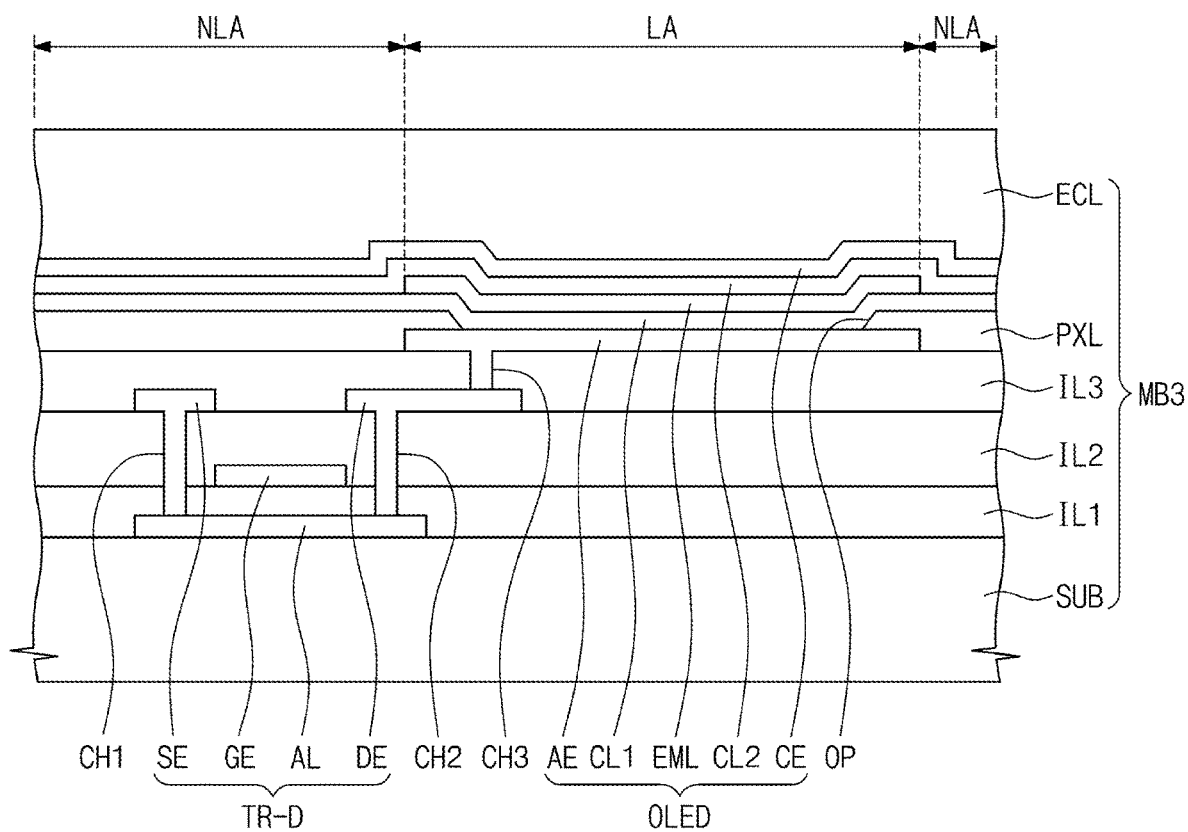
FIG. 5 is a cross-sectional view illustrating a pixel according to an embodiment of the invention.

FIG. 3 is a partial plan view illustrating a portion of the electronic apparatus of FIG. 1. FIG. 4 is an equivalent circuit diagram of a pixel according to an embodiment of the invention. FIG. 5 is a cross-sectional view illustrating a pixel according to an embodiment of the invention.

A portion of the display member MB3 is schematically illustrated in FIG. 3. Hereinafter, the electronic apparatus EA according to an embodiment of the invention will be described with reference to FIGS. 3 to 5.

As illustrated in FIG. 3, the display member MB3 may include a plurality of light emitting areas LA(i,j) to LA(i+1,j+2), and may also include a non-light emitting area NLA surrounding each of the light emitting areas LA(i,j) to LA(i+1,j+2) when viewed in a plan view. A portion in which six light emitting areas LA(i,j) to LA(i+1,j+2) are provided is illustrated as an example in FIG. 3.

Each of the light emitting areas LA(i,j) to LA(i+1,j+2) emits light. The six light emitting areas LA(i,j) to LA(i+1,j+2) may respectively emit lights having the same color as others, or having different colors than others.

The non-light emitting area NLA may separate the light emitting areas LA(i,j) to LA(i+1,j+2) from each other. The non-light emitting area NLA may block light emitted through peripheries of the light emitting areas LA(i,j) to LA(i+1,j+2) to reduce or prevent light leakage, and to clearly define the light emitting areas LA(i,j) to LA(i+1,j+2).

A display element for generating light may be located in each of the light emitting areas LA(i,j) to LA(i+1,j+2). In the present embodiment, the display element may be an organic light-emitting element. Signal interconnection lines for providing electrical signals to the display elements may be located to overlap with the non-light emitting area NLA.

An equivalent circuit of a pixel PX(i,j) is illustrated in FIG. 4. The pixel PX(i,j) includes at least one thin film transistor and the display element. FIG. 4 illustrates the embodiment in which the organic light-emitting element OLED is used as the display element. However, the configuration of the pixel PX(i,j) is not limited thereto and may be variously changed.

The pixel PX(i,j) receives a gate signal from an i-th gate line GLi, and receives a data signal from a j-th data line DLj. The pixel PX(i,j) receives a first power source voltage from a power line KL. The pixel PX(i,j) may include a switching thin film transistor TR-S, a driving thin film transistor TR-D, and a capacitor Cap, which collectively constitute a circuit part for driving the organic light-emitting element OLED.

The switching thin film transistor TR-S outputs the data signal, applied to the j-th data line DLj in response to the gate signal applied to the i-th gate line GLi. The capacitor Cap is charged with a voltage corresponding to the data signal received from the switching thin film transistor TR-S.

The driving thin film transistor TR-D is connected to the organic light-emitting element OLED. The driving thin film transistor TR-D controls a driving current flowing through the organic light-emitting element OLED in response to the amount of charges stored in the capacitor Cap. The organic light-emitting element OLED emits light during a turn-on period of the driving thin film transistor TR-D.

For the purpose of ease and convenience in description and illustration, FIG. 5 illustrates a cross-sectional view of a portion corresponding to the driving thin film transistor TR-D and the organic light-emitting element OLED of the equivalent circuit illustrated in FIG. 4. As illustrated in FIG. 5, insulating layers IL1, IL2, and IL3, the driving thin film transistor TR-D, and the organic light-emitting element OLED may be located on a base substrate SUB.

The base substrate SUB may be flexible and may have an insulating property. For example, the base substrate SUB may be a plastic substrate or a polymer film.

A semiconductor pattern AL of the driving thin film transistor TR-D is located on the base substrate SUB. A first insulating layer IL1 is located on the base substrate SUB and covers the semiconductor pattern AL. The first insulating layer IL1 includes an organic layer and/or an inorganic layer. The first insulating layer IL1 may include a plurality of thin layers.

A control electrode GE of the driving thin film transistor TR-D is located on the first insulating layer IL1. A second insulating layer IL2 is located on the first insulating layer IL1 and covers the control electrode GE. The second insulating layer IL2 includes an organic layer and/or an inorganic layer. The second insulating layer IL2 may include a plurality of thin layers.

An input electrode SE and an output electrode DE of the driving thin film transistor TR-D are located on the second insulating layer IL2. The input electrode SE and the output electrode DE are connected to portions of the semiconductor pattern AL through a first through-hole CH1 and a second through-hole CH2 penetrating the first and second insulating layers IL1 and IL2, respectively. On the other hand, in another embodiment, the driving thin film transistor TR-D may have a bottom gate structure.

A third insulating layer IL3 is located on the second insulating layer IL2 and covers the input electrode SE and the output electrode DE. The third insulating layer IL3 includes an organic layer and/or an inorganic layer. The third insulating layer IL3 may include a plurality of thin layers.

A pixel defining layer PXL and the organic light-emitting element OLED are located on the third insulating layer IL3. The organic light-emitting element OLED includes an anode AE, a first common layer CL1, an organic light-emitting layer EML, a second common layer CL2, and a cathode CE, which are sequentially stacked. The anode AE is connected to the output electrode DE through a third through-hole CH3 penetrating the third insulating layer IL3. Depending on a light-emitting direction of the organic light-emitting element OLED, positions of the anode AE and the cathode CE may be changed with each other, and positions of the first and second common layers CL1 and CL2 may be changed with each other.

The anode AE is located on the third insulating layer IL3. An opening OP of the pixel defining layer PXL exposes at least a portion of the anode AE.

The first common layer CL1 is located on the anode AE. The first common layer CL1 is located in the light emitting area LA corresponding to the opening OP and is also located in the non-light emitting area NLA. The first common layer CL1 includes a hole injection layer. The first common layer CL1 may further include a hole transfer layer.

The organic light-emitting layer EML is located on the first common layer CL1. The organic light-emitting layer EML may be exclusively located in an area corresponding to the opening OP. The second common layer CL2 is located on the organic light-emitting layer EML. The second common layer CL2 includes an electron injection layer. The second common layer CL2 may further include an electron transfer layer. The cathode CE is located on the second common layer CL2. The cathode CE is located in the light emitting area LA corresponding to the opening OP and is also located in the non-light emitting area NLA.

An encapsulation layer ECL is located on the cathode CE. The encapsulation layer ECL overlaps both the light emitting area LA and the non-light emitting area NLA. The encapsulation layer ECL includes an organic layer and/or an inorganic layer. In another embodiment of the invention, a fourth insulating layer for planarization may be located between the cathode CE and the encapsulation layer ECL. In still another embodiment, the encapsulation layer ECL may be replaced with an encapsulation substrate.

In some embodiments, the switching thin film transistor TR-S may have substantially the same structure as the driving thin film transistor TR-D. In addition, two electrodes of the capacitor Cap may be located on respective ones of the first insulating layer IL1, the second insulating layer IL2, and the third insulating layer IL3.

Figure 6:
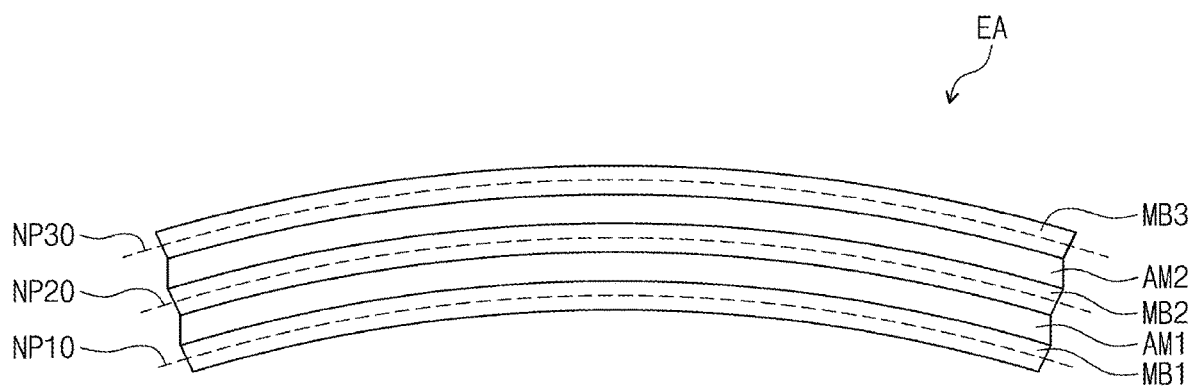
FIG. 6 is a cross-sectional view illustrating a neutral plane occurring in an electronic apparatus according to an embodiment of the invention.
Figure 7A:
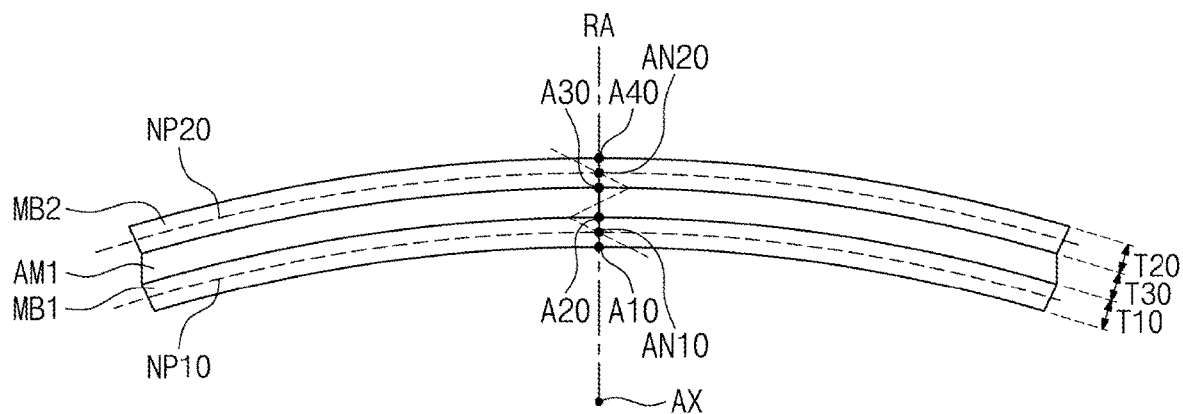
FIG. 7A is a cross-sectional view illustrating some components of the electronic apparatus of FIG. 6.
Figure 7B:
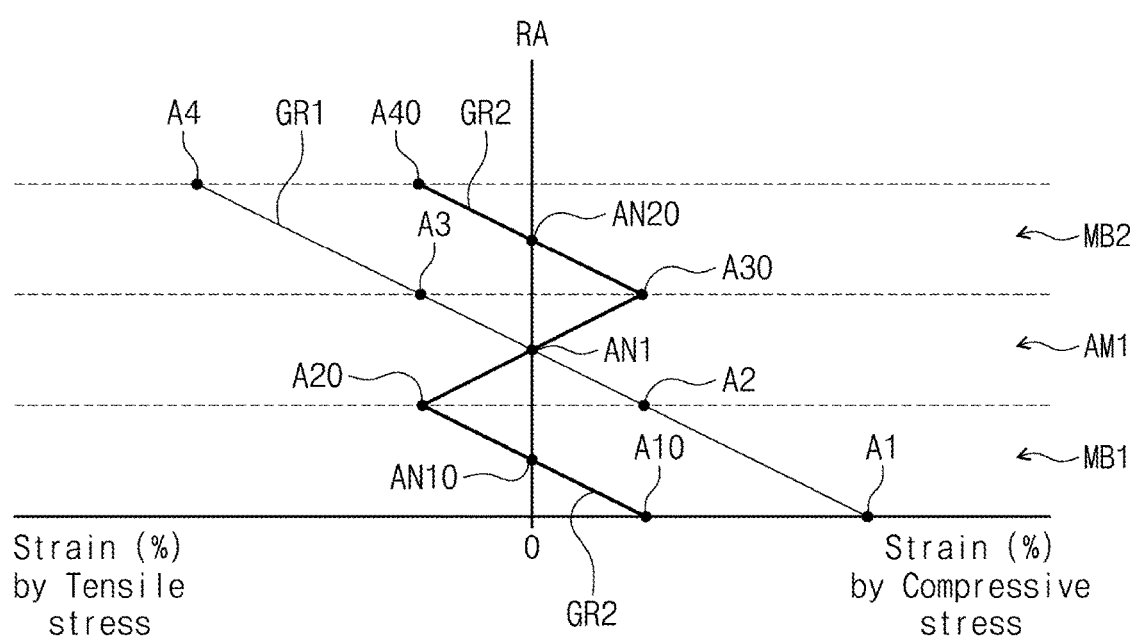
FIG. 7B is a graph illustrating strains of the components illustrated in FIG. 7A.

FIG. 6 is a cross-sectional view illustrating a neutral plane occurring in an electronic apparatus according to an embodiment of the invention. FIG. 7A is a cross-sectional view illustrating some components of the electronic apparatus of FIG. 6. FIG. 7B is a graph illustrating strains of the components illustrated in FIG. 7A. Hereinafter, the electronic apparatus according to an embodiment of the invention will be described with reference to FIGS. 6, 7A, and 7B.

As illustrated in FIG. 6, a plurality of neutral planes may be defined in the electronic apparatus EA according to an embodiment of the invention. The neutral plane may be a plane where applied tensile stress and compressive stress cancel each other such that an applied stress is substantially zero (0).

When the electronic apparatus EA is bent, each of the first and second adhesive members AM1 and AM2 partially decouples two adjacent members in terms of stress. Thus, even though the window member MB1, the optical member MB2, and the display member MB3 are coupled to each other by the first and second adhesive members AM1 and AM2 to constitute the single electronic apparatus EA, the stresses respectively applied to the members MB1, MB2, and MB3 may be decoupled from each other and may be independent of each other.

Therefore, the neutral planes of the electronic apparatus EA may be defined at the window member MB1, the optical member MB2, and the display member MB3, respectively. The neutral plane NP10 of the window member MB1 may be defined in the window member MB1. The neutral plane NP20 of the optical member MB2 may be defined in the optical member MB2. In addition, the neutral plane NP30 of the display member MB3 may be defined in the display member MB3.

In the electronic apparatus EA according to an embodiment of the invention, because the neutral planes NP10, NP20, and NP30 are defined in the window member MB1, the optical member MB2, and the display member MB3, respectively, it is possible to reduce or prevent damage or cracks of the window, optical, and display members MB1, MB2, and MB3 otherwise caused by bending stress. As a result, reliability of the electronic apparatus EA may be improved.

FIG. 7A is a cross-sectional view illustrating some components of the electronic apparatus EA illustrated in FIG. 6, and FIG. 7B illustrates a strain change corresponding to FIG. 7A. FIGS. 7A and 7B illustrate the first adhesive member AM1 and the first and second members MB1 and MB2 coupled to each other by the first adhesive member AM1 for the purpose of ease and convenience in description and illustration.

In addition, a comparative strain graph GR1 and a strain graph GR2 corresponding to an embodiment of the invention occurring in FIG. 7A are illustrated in FIG. 7B for the purpose of ease and convenience in description. The comparative strain graph GR1 and the strain graph GR2 corresponding to an embodiment of the invention show strains according to a reference line RA.

The comparative strain graph GR1 may be a strain graph of an example in which the first adhesive member AM1 according to an embodiment of the invention is replaced with another component. According to the comparative strain graph GR1, a strain occurring in each member of an electronic apparatus may be dominantly affected by compressive stress as a distance from a curvature center AX decreases, and may be dominantly affected by tensile stress as a distance from the curvature center AX increases. Thus, strain caused by the tensile stress may be dominantly shown in the second member MB2, and strain caused by the compressive stress may be dominantly shown in the first member MB1.

According to the strain graph GR2 of the invention, the strain by the tensile stress and the strain by the compressive stress occurring in corresponding members are less than those of the comparative example. When points A1, A2, A3, and A4 of the comparative strain graph GR1 are compared to corresponding points A10, A20, A30, and A40 of the strain graph GR2 corresponding to an embodiment of the invention, the strains of the electronic apparatus according to the present embodiment are less than those of the electronic apparatus according to the comparative example. Thus, even though the electronic apparatus according to the present embodiment is bent, magnitudes of the strains applied to the components can be relatively reduced to improve the reliability of the electronic apparatus in terms of the bending stress.

On the other hand, the electronic apparatus according to an embodiment of the invention may be bent on, or with respect to, a curvature center that is closer to the third member MB3 than to the first member MB1. In this case, a strain graph of the electronic apparatus may have a reversed or mirrored shape of the strain graph GR2 corresponding to an embodiment of the invention of FIG. 7B with respect to the reference line RA.

Figure 8:
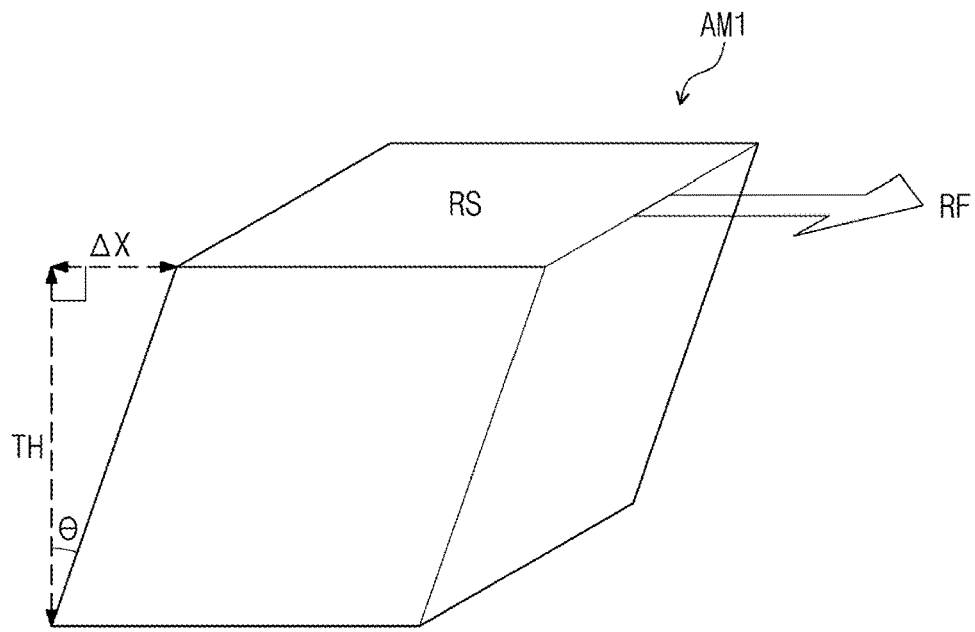
FIG. 8 is a perspective view illustrating a state of a first adhesive member according to an embodiment of the invention.

FIG. 8 is a perspective view illustrating a state of a first adhesive member according to an embodiment of the invention. FIG. 8 illustrates the first adhesive member AM1 to which shear stress is applied from the outside. Hereinafter, the first adhesive member AM1 according to an embodiment of the invention will be described with reference to FIG. 8.

As illustrated in FIG. 8, when the shear stress is applied to the first adhesive member AM1, the shape of the first adhesive member AM1 is deformed and force RF is applied to the first adhesive member AM1. The force RF applied to the first adhesive member AM1 may substantially correspond to the shear stress.

The shear stress applied to the first adhesive member AM1 may be determined by a ratio of a horizontal cross-sectional area RS of the first adhesive member AM1 and the force RF applied to the first adhesive member AM1.

A portion of the first adhesive member AM1 (e.g., a top surface of the first adhesive member AM1) is shifted in a direction parallel to a direction of the force RF applied to the first adhesive member AM1. A deformed shape of the first adhesive member AM1 is due to a displacement $\Delta X$ occurring by the shift of the portion of the first adhesive member AM1. The displacement $\Delta X$ may be one of factors determining the strain occurring in the first adhesive member AM1.

In more detail, the strain occurring in the first adhesive member AM1 may be determined by a ratio of a thickness TH of the first adhesive member AM1 and the displacement $\Delta X$ shown at the first adhesive member AM1. In the present embodiment, the strain occurring in the first adhesive member AM1 may correspond to the tangent of an angle θ (e.g., tan θ).

In the present embodiment, a modulus of the first adhesive member AM1 may have a value of about 0.1 MPa or less at room temperature and a value of about 0.2 MPa or less at a low temperature (e.g., −20° C.). For example, the first adhesive member AM1 may have a modulus of about 0.09 MPa or less at room temperature, or may have a modulus of about 0.06 MPa or less at 60° C.

The bending stress applied to the component (e.g., the first member MB1) being in contact with the first adhesive member AM1 may increase as the modulus of the first adhesive member AM1 increases. Because the electronic apparatus EA (see FIG. 1) according to an embodiment of the invention may include the first adhesive member AM1 having the modulus of the values described above, it is possible to reduce or prevent buckling, or to prevent a crack from occurring, in the first member MB1 that is in contact with the first adhesive member AM1.

In the present embodiment, a stress relaxation of the first adhesive member AM1 may be about 70% or less. The stress relaxation is obtained by measuring a degree to which the force RF applied to the first adhesive member AM1 decreases with time in a state in which a shear stress (e.g., a predetermined shear stress) is applied to provide a strain (e.g., a predetermined strain) to the first adhesive member AM1. A restoring force for returning to an original state may decrease as the stress relaxation increases. In the present embodiment, the stress relaxation of the first adhesive member AM1 may be a stress relaxation when a strain of about 300% occurs.

If the stress relaxation of the first adhesive member AM1 is greater than 70%, it is difficult to obtain a sufficient restoring force. In this case, a wrinkle may occur at the first adhesive member AM1 due to the bending stress. However, the electronic apparatus EA according to an embodiment of the invention may include the first adhesive member AM1 having the stress relaxation of the values described above, and thus the electronic apparatus EA may have improved bending characteristics.

Figure 9:
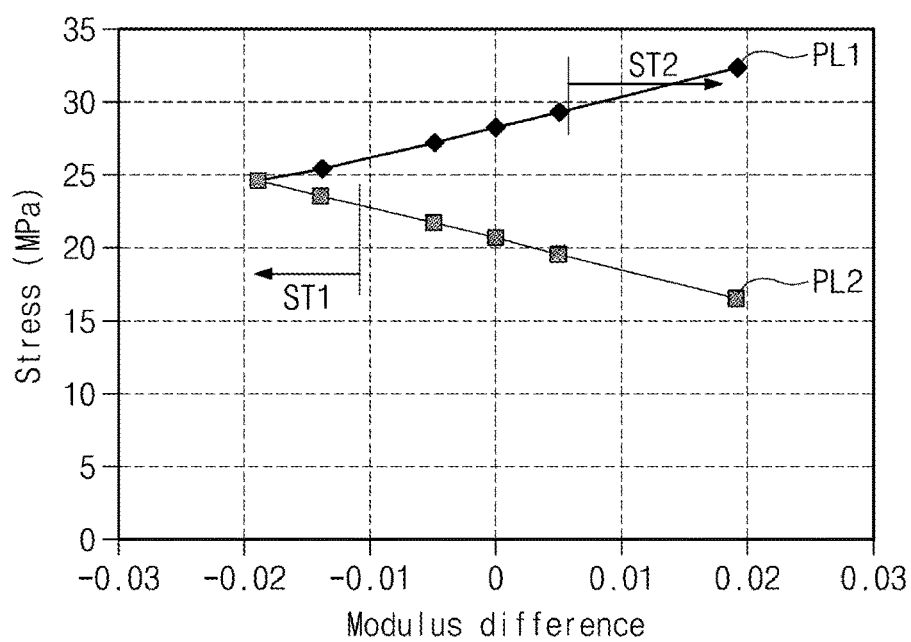
FIG. 9 is a graph illustrating a stress change according to a modulus difference.
Figure 10A:
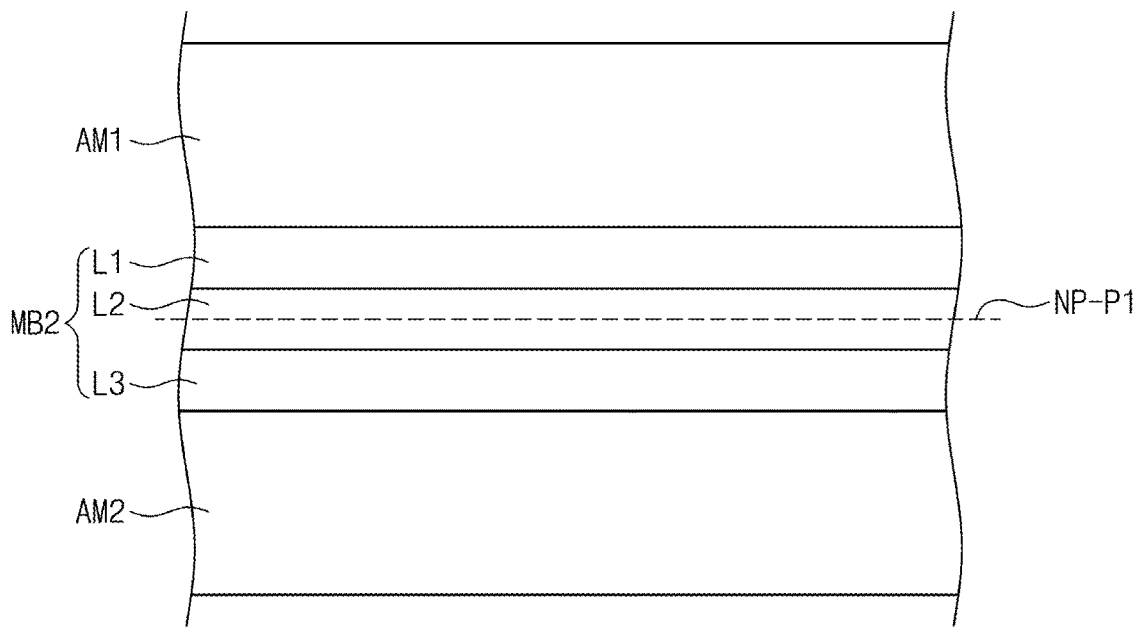
FIGS. 10A to 10C are partial cross-sectional views illustrating some components of an electronic apparatus according to an embodiment of the invention.
Figure 10B:
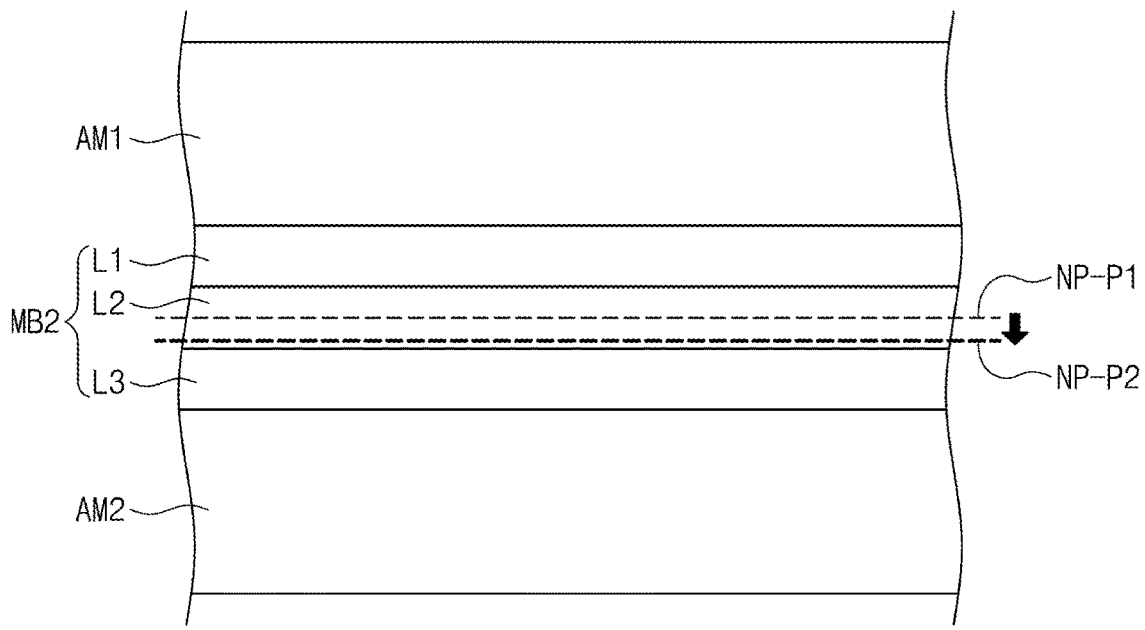
Figure 10C:
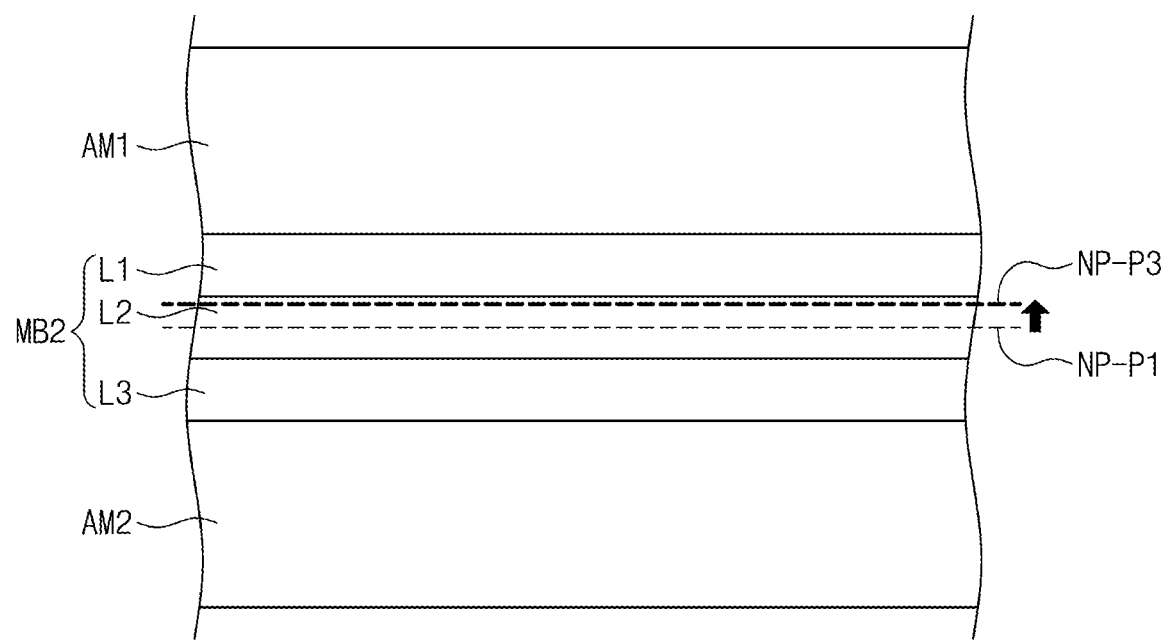

FIG. 9 is a graph illustrating a stress change according to a modulus difference. FIGS. 10A to 10C are partial cross-sectional views illustrating some components of an electronic apparatus according to an embodiment of the invention.

FIG. 9 illustrates a stress change of the second member MB2 according to a modulus difference between the first adhesive member AM1 and the second adhesive member AM2. The first adhesive member AM1, the second adhesive member AM2, and the second member MB2 may correspond to the first adhesive member AM1, the second adhesive member AM2, and the second member MB2 of the electronic apparatus EA illustrated in FIG. 1, respectively.

FIGS. 10A to 10C illustrate embodiments of which modulus differences between the first and second adhesive members AM1 and AM2 are different from each other. In addition, FIGS. 10A to 10C illustrate neutral planes respectively defined in the embodiments. Hereinafter, the electronic apparatus according to an embodiment of the invention will be described with reference to FIGS. 9 and 10A to 10C.

As illustrated in FIG. 9, the stress applied to the second member MB2 located between the first and second adhesive members AM1 and AM2 when bending the electronic apparatus may be changed depending on the modulus difference between the first and second adhesive members AM1 and AM2. In FIG. 9, the modulus difference between the first and second adhesive members AM1 and AM2 is a value obtained by subtracting a modulus of the second adhesive member AM2 from a modulus of the first adhesive member AM1. Thus, when the modulus of the first adhesive member AM1 is greater than the modulus of the second adhesive member AM2, the modulus difference between the first and second adhesive members AM1 and AM2 has a positive value. On the contrary, when the modulus of the first adhesive member AM1 is less than the modulus of the second adhesive member AM2, the modulus difference between the first and second adhesive members AM1 and AM2 has a negative value.

On the assumption that the electronic apparatus is bent like the electronic apparatus EA illustrated in FIG. 2, a tensile stress occurring in the second member MB2 is illustrated as a first plot PL1 in FIG. 9, and a compressive stress occurring in the second member MB2 is illustrated as a second plot PL2 in FIG. 9.

FIGS. 10A to 10C illustrate the second member MB2 in more detail. As illustrated in FIGS. 10A to 10C, the second member MB2 may have a stack structure that includes a plurality of stacked layers including a first layer L1, a second layer L2, and a third layer L3. The first layer L1, the second layer L2, and the third layer L3 may be sequentially located, the first layer L1 may be adjacent to the first adhesive member AM1, and the third layer L3 may be adjacent to the second adhesive member AM2.

As illustrated in FIG. 10A, when the modulus difference between the first and second adhesive members AM1 and AM2 is substantially zero (0), a neutral plane NP-P1 (e.g., a first neutral plane) of the second member MB2 may be defined at a central plane of the second member MB2. The first neutral plane NP-P1 may be defined at a middle point between a bottom surface and a top surface of the second member MB2. The first neutral plane NP-P1 may be defined at a center of the second layer L2 corresponding to an intermediate layer.

In the present embodiment, the electronic apparatus bent as illustrated in FIG. 2 is described as an example. Thus, the first plot PL1 of FIG. 9 may correspond to a tensile stress occurring in the third layer L3, and the second plot PL2 of FIG. 9 may correspond to a compressive stress occurring in the first layer L1.

However, embodiments of the invention are not limited thereto. In another embodiment, when the electronic apparatus is bent in a direction opposite to the bending direction of FIG. 2, the first plot PL1 may correspond to a tensile stress occurring in the first layer L1, and the second plot PL2 may correspond to a compressive stress occurring in the third layer L3. The electronic apparatus according to an embodiment of the invention may have at least one of various shapes and may variously bent, and the invention is not limited to any particular one of the embodiments.

Referring to FIGS. 9 and 10A, when the modulus difference between the first and second adhesive members AM1 and AM2 is substantially zero, the stress occurring in the third layer L3 may be a tensile stress having a middle magnitude in a stress range shown in the first plot PL1. In addition, the stress occurring in the first layer L1 may be a compressive stress having a middle magnitude in a stress range shown in the second plot PL2.

FIG. 10B illustrates an embodiment in which the modulus of the second adhesive member AM2 is greater than the modulus of the first adhesive member AM1. As illustrated in FIG. 10B, when the modulus of the first adhesive member AM1 is less than the modulus of the second adhesive member AM2, a neutral plane NP-P2 (e.g., a second neutral plane) of the second member MB2 may be shifted from the center of the second member MB2 toward the second adhesive member AM2.

The second neutral plane NP-P2 may be shifted toward the member having a relatively great modulus. Thus, the second neutral plane NP-P2 may be defined at a position shifted from the first neutral plane NP-P1 toward the second adhesive member AM2 in an arrow direction shown in FIG. 10B.

At this time, the modulus difference between the first and second adhesive members AM1 and AM2 has a negative value. Thus, the stresses occurring in the second member MB2 may be represented by left side portions of the first and second plots PL1 and PL2 (e.g., left of a position at which the modulus difference is zero) in FIG. 9.

Referring to FIGS. 9 and 10B, the compressive stress in the first layer L1 increases along the second plot PL2 as the absolute value of the modulus difference between the first and second adhesive members AM1 and AM2 increases. On the contrary, the tensile stress in the third layer L3 increases along the first plot PL1 as the absolute value of the modulus difference between the first and second adhesive members AM1 and AM2 increases.

Thus, the second member MB2 may be relatively significantly affected by the compressive stress as the absolute value of the modulus difference between the first and second adhesive members AM1 and AM2 increases from 0. A first state ST1 of FIG. 9 may be a state in which a defect (e.g., a wrinkle) occurs at the first layer L1.

According to an embodiment of the invention, the absolute value of the modulus difference between the first and second adhesive members AM1 and AM2 may be about 0.01 MPa or less. In other words, the modulus difference between the first and second adhesive members AM1 and AM2 may range from about −0.01 MPa to about 0.01 MPa. In the electronic apparatus according to an embodiment of the invention, the moduli of the first and second adhesive members AM1 and AM2 may be adjusted to reduce or prevent defects (e.g., a wrinkle or a delamination phenomenon) otherwise caused by the compressive stress. As a result, the reliability of the electronic apparatus may be improved.

FIG. 10C illustrates an embodiment in which the modulus of the second adhesive member AM2 is less than the modulus of the first adhesive member AM1. As illustrated in FIG. 10C, when the modulus of the first adhesive member AM1 is greater than the modulus of the second adhesive member AM2, a neutral plane NP-P3 (e.g., a third neutral plane) of the second member MB2 may be shifted from the center of the second member MB2 toward the first adhesive member AM1.

The third neutral plane NP-P3 may be shifted toward the member having a relatively great, or greater, modulus. Thus, the third neutral plane NP-P3 may be defined at a position shifted from the first neutral plane NP-P1 toward the first adhesive member AM1 in an arrow direction shown in FIG. 10C.

At this time, the modulus difference between the first and second adhesive members AM1 and AM2 has a positive value. Thus, the stresses occurring in the second member MB2 may be represented by a right side of the first and second plots PL1 and PL2 (e.g., to the right of the position at which the modulus difference is zero) in FIG. 9.

Referring to FIGS. 9 and 10C, the compressive stress in the first layer L1 decreases along the second plot PL2 as the modulus difference between the first and second adhesive members AM1 and AM2 increases. On the contrary, the tensile stress in the third layer L3 increases along the first plot PL1 as the modulus difference between the first and second adhesive members AM1 and AM2 increases.

Thus, the second member MB2 may be relatively significantly affected by the tensile stress as the modulus difference between the first and second adhesive members AM1 and AM2 increases. A second state ST2 of FIG. 9 may be a state in which a defect (e.g., a wrinkle or crack) occurs at the third layer L3.

In the case in which the modulus of the first adhesive member AM1 is greater than the modulus of the second adhesive member AM2, a defect occurring at the third layer L3 due to the tensile stress may be reduced or prevented when the modulus difference between the first and second adhesive members AM1 and AM2 is about 0.005 MPa or less.

According to an embodiment of the invention, when the absolute value of the modulus difference between the first and second adhesive members AM1 and AM2 is about 0.01 MPa or less, it is possible to reduce or minimize a defect occurring at the second member MB2 otherwise caused by the bending stress. Even though the modulus of the first adhesive member AM1 is greater than the modulus of the second adhesive member AM2, the defect occurring at the second member MB2 may be reduced or prevented when the modulus difference between the first and second adhesive members AM1 and AM2 is adjusted to about 0.005 MPa or less.

However, embodiments of the invention are not limited thereto. In another embodiment, when the electronic apparatus is bent in a direction opposite to the bending direction of FIG. 2, the first plot PL1 may correspond to a tensile stress occurring in the first layer L1, and the second plot PL2 may correspond to a compressive stress occurring in the third layer L3. The electronic apparatus according to an embodiment of the invention may have at least one of various shapes and may variously bent, and the invention is not limited to any particular one of the embodiments.

Meanwhile, the following table 1 shows reliability evaluation results of samples of which moduli and stress relaxations of the first and second adhesive members are controlled differently from each other, according to a sample/example. The following table 1 shows the moduli and the stress relaxations measured at 60° C. and the results with respect to deformation of 300%. In addition, each of the first and second adhesive members shown in the following table 1 has a thickness of about 50 μm.

TABLE 1

| | | Sample 1 | Sample 2 | Sample 3 | Sample 4 | Sample 5 | Sample 6 |
|---|---|---|---|---|---|---|---|
| First adhesive member | Modulus (MPa) | 0.071 | 0.052 | 0.062 | 0.057 | 0.057 | 0.062 |
| | Stress relaxation (%) | 45 | 75 | 54 | 68 | 68 | 54 |
| Second adhesive member | Modulus (MPa) | 0.052 | 0.071 | 0.057 | 0.062 | 0.057 | 0.062 |
| | Stress relaxation (%) | 75 | 45 | 68 | 54 | 68 | 54 |
| Main defect | | Wrinkle of third layer | Wrinkle of first layer | — | — | — | — |
| Compressive stress (MPa) occurring in second member MB2 in second mode | | −16.48 | −24.54 | −19.58 | −21.59 | −20.66 | −20.52 |
| Tensile stress (MPa) occurring in second member MB2 in second mode | | 32.35 | 24.36 | 29.27 | 27.28 | 28.2 | 28.35 |
| Tensile stress (MPa) occurring in second member MB2 when second member MB2 is changed from second mode into first mode | | 15.18 | — | — | 0.56 | — | 5.16 |

Referring to the table 1, the sample 1 relates to an embodiment in which a modulus difference between the first and second adhesive members AM1 and AM2 is about 0.019 MPa and in which the stress relaxation of the first adhesive member AM1 is less than about 70% while the stress relaxation of the second adhesive member AM2 is greater than about 70%. In the present embodiment, the second adhesive member AM2 has the stress relaxation of about 75%. This case corresponds to the right side area of the position at which the modulus difference between the first and second adhesive members AM1 and AM2 is zero in the graph of FIG. 9. In addition, this case has the modulus difference in the range in which the second state ST2 may occur. Therefore, a defect (e.g., a wrinkle) occurred at the third layer L3 in the sample 1.

The sample 2 has a stack structure opposite to that of the sample 1. In other words, the sample 2 relates to an embodiment in which a modulus difference between the first and second adhesive members AM1 and AM2 is about −0.019 MPa and in which the stress relaxation of the second adhesive member AM2 is less than about 70% while the stress relaxation of the first adhesive member AM1 is greater than about 70%. In the present embodiment, the first adhesive member AM1 has the stress relaxation of about 75%. This case corresponds to the left side area of the graph illustrated in FIG. 9, and has the modulus difference in the range in which the first state ST1 may occur. Therefore, a defect (e.g., a wrinkle) occurred at the first layer L1 in the sample 2.

The sample 3 relates to an embodiment in which a modulus difference between the first and second adhesive members AM1 and AM2 is about 0.005 MPa, and in which each of the first and second adhesive members AM1 and AM2 has the stress relaxation that is less than about 70%. The first adhesive member AM1 may have the modulus that is equal to or greater than about 0.06 MPa at 60° C. In the present embodiment, the first adhesive member AM1 has the modulus of 0.062 MPa.

The sample 3 corresponds to the area to the right of the position at which the modulus difference between the first and second adhesive members AM1 and AM2 is zero in the graph of FIG. 9. The modulus difference of 0.005 MPa may be a value at which the second state ST2 does not occur. Thus, no defect occurred in the sample 3.

The sample 4 has a stack structure opposite to that of the sample 3. In other words, the sample 4 relates to an embodiment in which a modulus difference between the first and second adhesive members AM1 and AM2 is about −0.005 MPa and each of the first and second adhesive members AM1 and AM2 has the stress relaxation that is less than about 70%.

The sample 4 has the modulus difference in a range in which the first state ST1 does not occur corresponding to a central area of the graph illustrated in FIG. 9. Thus, a specific defect did not occur in the sample 4.

The sample 5 relates to an embodiment in which a modulus difference between the first and second adhesive members AM1 and AM2 is substantially zero. In other words, in the sample 5, the first adhesive member AM1 is substantially the same as the second adhesive member AM2. In the present embodiment, each of the first and second adhesive members AM1 and AM2 has the modulus equal to or less than about 0.06 MPa. For example, in the sample 5, each of the first and second adhesive members AM1 and AM2 has the modulus of about 0.057 MPa.

Thus, the stress relaxation of the first adhesive member AM1 is approximately equal to the stress relaxation of the second adhesive member AM2. Because each of the first and second adhesive members AM1 and AM2 of the sample 5 has the stress relaxation that is less than about 70%, the sample 5 may correspond to the above embodiment of the invention.

The sample 6 relates to an embodiment in which a modulus difference between the first and second adhesive members AM1 and AM2 is substantially zero. In other words, in the sample 6, the first adhesive member AM1 is substantially the same as the second adhesive member AM2. Thus, the stress relaxation of the first adhesive member AM1 is approximately equal to the stress relaxation of the second adhesive member AM1.

However, each of the first and second adhesive members AM1 and AM2 of the sample 6 has the modulus that is greater than about 0.06 MPa, unlike the sample 5. For example, in the sample 6, each of the first and second adhesive members AM1 and AM2 has the modulus of about 0.062 MPa.

In this case, as shown in the table 1, the tensile stress occurring in the second member MB2 is about 5.16 MPa when the second member MB2 is changed from the second mode into the first mode. Thus, a probability of occurrence of a defect in the second member MB2 of the sample 6 may not be greater than a probability of occurrence of a defect in the second member MB2 of the sample 1, but may be greater than a probability of occurrence of a defect in the second member MB2 of the sample 4.

The electronic apparatus according to an embodiment of the invention may include the first and second adhesive members AM1 and AM2 that have the stress relaxations that are equal to or less than about 70%, and of which the modulus difference is equal to or less than 0.01 MPa. In addition, each of the first and second adhesive members AM1 and AM2 may have the modulus of about 0.06 MPa or less at about 60° C., or may have the modulus of about 0.09 MPa or less at the room temperature. As a result, it is possible to relax the stress concentrated to the adhesive member or layers adjacent to the adhesive member. Because physical properties of the first and second adhesive members AM1 and AM2 are designed in more detail in the electronic apparatus according to an embodiment of the invention, it is possible to reduce, minimize, or prevent a defect which may occur in a flexible electronic apparatus by bending stress. As a result, the electronic apparatus can have improved reliability and bending characteristics.

Figure 11A:
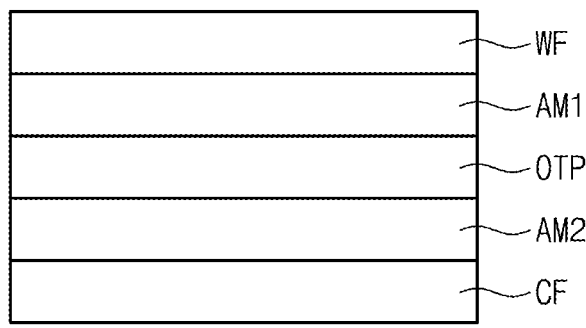
FIGS. 11A to 11C are cross-sectional views illustrating electronic apparatuses according to some embodiments of the invention.
Figure 11B:
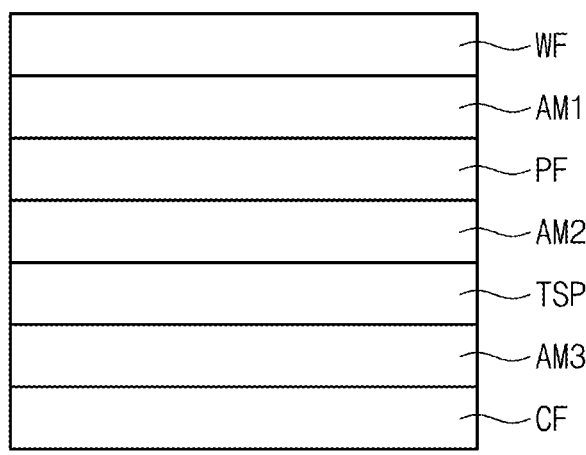
Figure 11C:
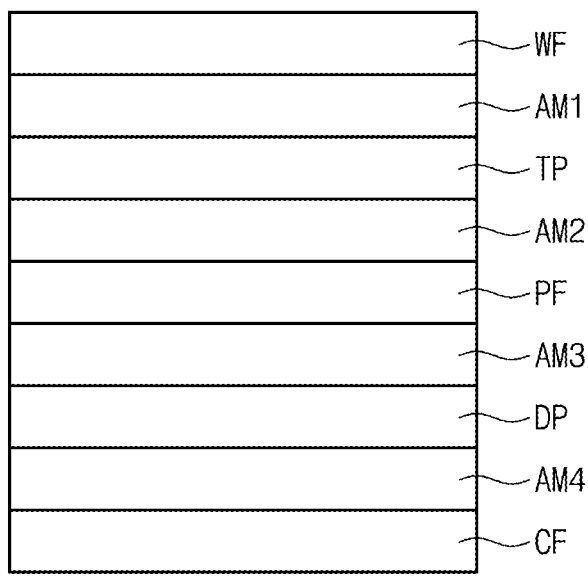

FIGS. 11A to 11C are cross-sectional views illustrating electronic apparatuses according to some embodiments of the invention. Hereinafter, electronic apparatuses according to some embodiments of the invention will be described with reference to FIGS. 11A to 11C. In addition, the same components as described with reference to FIGS. 1 to 10C will indicated by the same reference numerals or designators, and repeated descriptions thereto will omitted or mentioned briefly for the purpose of ease and convenience in description and illumination.

As illustrated in FIG. 11A, an electronic apparatus may include a window film WF, a first adhesive member AM1, a touch screen panel OTP, a second adhesive member AM2, and a cover film CF. The window film WF is located at the uppermost layer of the electronic apparatus to protect the touch screen panel OTP. The window film WF may correspond to the first member MB1 illustrated in FIG. 1.

The cover film CF is located at the lowermost layer of the electronic apparatus to protect the touch screen panel OTP. The cover film CF may include a material that is flexible and has a high strength. The cover film CF, for example, may include metal to help heat radiation from the display panel DP and to protect the display panel DP. The cover film CF may correspond to the third member MB3 illustrated in FIG. 1.

The touch screen panel OTP may display an image and may sense a touch applied from the outside. The touch screen panel OTP may include a plurality of pixels and may include a plurality of conductive sensors for sensing a touch. The touch may include a direct touch or a proximity touch, and may be provided in various forms such as a body part of a user, light, pressure, and heat.

In an embodiment, the touch screen panel OTP may further include an anti-reflection layer. The anti-reflection layer may substantially perform a polarization function. The anti-reflection layer may be formed directly at the touch screen panel OTP.

The first adhesive member AM1 and the second adhesive member AM2 may correspond to the first adhesive member AM1 and the second adhesive member AM2 of FIG. 1, respectively. Thus, repeated detailed descriptions thereto are omitted. The electronic apparatus according to an embodiment of the invention may include the first adhesive member AM1 and the second adhesive member AM2, and thus it is possible to prevent electronic devices and sensors included in the touch screen panel OTP from being damaged by bending stress.

As illustrated in FIG. 11B, an electronic apparatus may include a window film WF, a first adhesive member AM1, a polarizing film PF, a second adhesive member AM2, a touch screen panel TSP, a third adhesive member AM3, and a cover film CF. Other components of the electronic apparatus of FIG. 11B, with the exception of the polarizing film PF, the touch screen panel TSP, and the third adhesive member AM3, may be substantially the same as corresponding components of the electronic apparatus of FIG. 11A.

The polarizing film PF may be an optical film that polarizes incident light. The polarizing film PF may have a stack structure in which a support layer and at least one phase retardation layer are stacked. For example, the support layer and a plurality of phase retardation layers may correspond to the first to third layers L1 to L3 illustrated in FIG. 10, respectively.

The polarizing film PF may solve or prevent a problem whereby visibility is otherwise deteriorated due to reflection of external light caused at the touch screen panel TSP. In other words, the polarizing film PF may function as an anti-reflection film of the touch screen panel TSP.

The touch screen panel TSP may display an image and may sense a touch applied from the outside. A structure of the touch screen panel TSP may correspond to the structure of the touch screen panel OTP (see FIG. 11A) from which the anti-reflection layer is omitted.

The third adhesive member AM3 may be designed to correspond to each of the first and second adhesive members AM1 and AM2 according to the above embodiment of the invention. In more detail, the third adhesive member AM3 may have the modulus of about 0.06 MPa or less at about 60° C., or may have the modulus of about 0.09 MPa or less at the room temperature, and may have a stress relaxation of about 70% or less. In addition, a modulus difference between the second and third adhesive members AM2 and AM3 may be about 0.01 MPa or less.

Because the electronic apparatus according to an embodiment of the invention includes a plurality of the adhesive members designed to appropriate levels and characteristics, it is possible to prevent the polarizing film PF or the touch screen panel TSP from being damaged by bending stress. In addition, it is possible to prevent a delamination problem from occurring in a stack structure including a plurality of thin films, such as the polarizing film PF. As a result, the electronic apparatus with improved reliability may be provided.

As illustrated in FIG. 11C, an electronic apparatus may include a window film WF, a first adhesive member AM1, a touch panel TP, a second adhesive member AM2, a polarizing film PF, a third adhesive member AM3, a display panel DP, a fourth adhesive member AM4, and a cover film CF. Other components of the electronic apparatus of FIG. 11C, with the exception of the touch panel TP, the display panel DP, and the fourth adhesive member AM4, may be substantially the same as corresponding components of the electronic apparatus of FIG. 11B.

The touch panel TP may sense an external touch, and the display panel DP may display an image. In the present embodiment, the touch panel TP and the display panel DP may be provided separately from each other, and may be adhered to each other by the second adhesive member AM2. The display panel DP may correspond to the second member MB2 illustrated in FIG. 1.

The fourth adhesive member AM4 may be designed to correspond to each of the first and second adhesive members AM1 and AM2 according to the above embodiment of the invention. In more detail, the fourth adhesive member AM4 may have a modulus of about 0.06 MPa or less at 60° C., or may have a modulus of about 0.09 MPa or less at the room temperature, and may have a stress relaxation of about 70% or less. In addition, a modulus difference between the third and fourth adhesive members AM3 and AM4 may be about 0.01 MPa or less.

Because the electronic apparatus according to an embodiment of the invention includes a plurality of the adhesive members designed to appropriate levels, it is possible to relax or minimize the bending stresses occurring in various members coupled to each other by the adhesive members. Thus, bending characteristics and reliability of the electronic apparatus may be improved.

According to embodiments of the invention, the bending characteristics and reliability of the electronic apparatus having a relatively fine radius of curvature can be improved by finely designing and/or adjusting the physical properties of the adhesive members coupling a plurality of members included in the electronic apparatus.

While the invention has been described with reference to example embodiments, it will be apparent to those skilled in the art that various changes and modifications may be made without departing from the spirits and scopes of the invention. Therefore, it should be understood that the above embodiments are not limiting, but illustrative. Thus, the scopes of the invention are to be determined by the broadest permissible interpretation of the following claims and their equivalents, and shall not be restricted or limited by the foregoing description.

What is claimed is:

1. An electronic apparatus comprising:
   a first adhesive member having a first modulus;
   a second adhesive member having a second modulus; and
   a flexible member between, and contacting, the first adhesive member and the second adhesive member,
   wherein a stress relaxation of the first adhesive member is about 70% or less and a stress relaxation of the second adhesive member is about 70% or less,
   wherein an absolute value of a difference between the first modulus and the second modulus is about 0.01 MPa or less,
   wherein a radius of curvature of the first adhesive member is smaller than a radius of curvature of the second adhesive member with respect to a common curvature center, and
   wherein the first modulus is greater than the second modulus.

2. The electronic apparatus of claim 1, wherein a radius of curvature of the flexible member is about 10 mm or less.

3. The electronic apparatus of claim 1, wherein each of the first modulus and the second modulus is about 0.06 MPa or less at about 60° C.

4. The electronic apparatus of claim 1, wherein each of the first and second adhesive members comprises one or more of a silicon-based polymer, a urethane-based polymer and an acrylic-based polymer, a crosslinking agent, and a resin.

5. The electronic apparatus of claim 1, wherein the flexible member comprises at least one of a polarizing film, a display panel, or a touch panel.

6. The electronic apparatus of claim 5, wherein the flexible member comprises a plurality of films.

7. The electronic apparatus of claim 1, further comprising:
   a window member on and contacting the first adhesive member; and
   a cover member under and contacting the second adhesive member.

8. The electronic apparatus of claim 7, wherein the window member comprises a polymer film, a plastic substrate, or a thin glass film.

9. The electronic apparatus of claim 7, wherein the cover member comprises a metal.

10. An electronic apparatus comprising:
    a display panel;
    a polarizing film on the display panel;
    a window member on the polarizing film;
    a first adhesive member between and contacting the window member and the polarizing film, and having a first modulus; and
    a second adhesive member between and contacting the polarizing film and the display panel, and having a second modulus,
    wherein a stress relaxation of the first adhesive member is about 70% or less and a stress relaxation of the second adhesive member is about 70% or less, and
    wherein an absolute value of a difference between the first modulus and the second modulus is about 0.01 MPa or less.

11. The electronic apparatus of claim 10, wherein the polarizing film comprises a plurality of layers.

12. The electronic apparatus of claim 11, wherein the plurality of layers comprises a phase retardation film and a cyclo-olefin polymer (COP) film.

13. The electronic apparatus of claim 11, wherein each of the first modulus and the second modulus is about 0.06 MPa or less at about 60° C.

14. The electronic apparatus of claim 13, wherein each of the first and second adhesive members comprises one or more of a silicon-based polymer, a urethane-based polymer and an acrylic-based polymer, a crosslinking agent, and a resin.

15. The electronic apparatus of claim 10, wherein the window member comprises a thin glass film.

16. The electronic apparatus of claim 10, wherein a radius of curvature of the first adhesive member is smaller than a radius of curvature of the second adhesive member with respect to a common curvature center, and
wherein the first modulus is greater than the second modulus.

17. The electronic apparatus of claim 16, wherein the radius of curvature of the first adhesive member is about 10 mm or less.

18. The electronic apparatus of claim 10, wherein the second modulus is greater than the first modulus, and
wherein the absolute value of the difference between the first modulus and the second modulus is about 0.005 MPa or less.

19. An electronic apparatus comprising:
a display panel;
a polarizing film on the display panel;
a window member on the polarizing film;
a sensing member between the polarizing film and the window member to sense an external touch provided to the window member;
a first adhesive member between and contacting the window member and the sensing member, and having a first modulus; and
a second adhesive member between and contacting the sensing member and the polarizing film, and having a second modulus,
wherein a stress relaxation of the first adhesive member is about 70% or less and a stress relaxation of the second adhesive member is about 70% or less, and
wherein an absolute value of a difference between the first modulus and the second modulus is about 0.01 MPa or less.

* * * * *